United States Patent
Pan et al.

(10) Patent No.: US 7,622,371 B2
(45) Date of Patent: Nov. 24, 2009

(54) FUSED NANOCRYSTAL THIN FILM SEMICONDUCTOR AND METHOD

(75) Inventors: Alfred Pan, Palo Alto, CA (US); Hou T. Ng, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 71 days.

(21) Appl. No.: 11/548,230

(22) Filed: Oct. 10, 2006

(65) Prior Publication Data

US 2008/0083950 A1    Apr. 10, 2008

(51) Int. Cl.
    *H01L 29/786* (2006.01)
(52) U.S. Cl. .............................. 438/500; 977/892
(58) Field of Classification Search ............... 438/149, 438/479, 497, 481, 486, 492, 500, 104, 493; 977/883, 892; 117/11, 16, 23, 54, 67, 68
See application file for complete search history.

(56) References Cited

U.S. PATENT DOCUMENTS

| | | | |
|---|---|---|---|
| 6,720,240 B2 | 4/2004 | Gole et al. | |
| 6,867,081 B2 | 3/2005 | Weng et al. | |
| 7,067,843 B2 | 6/2006 | Carcia et al. | |
| 7,094,709 B2 * | 8/2006 | Karkkainen | 438/780 |
| 7,265,376 B2 * | 9/2007 | Graham et al. | 257/40 |
| 7,326,366 B2 * | 2/2008 | Aiba et al. | 252/301.6 S |
| 7,381,586 B2 * | 6/2008 | Cheng et al. | 438/104 |
| 2005/0016862 A1 * | 1/2005 | Sano et al. | 205/305 |
| 2006/0105513 A1 | 5/2006 | Afzali-Ardakani | |
| 2006/0105523 A1 | 5/2006 | Afzali-Ardakani et al. | |
| 2006/0205240 A1 | 9/2006 | Pan et al. | |
| 2007/0154385 A1 * | 7/2007 | Min et al. | 423/622 |

FOREIGN PATENT DOCUMENTS

| | | | |
|---|---|---|---|
| JP | WO 2006/132439 | * | 12/2000 |
| NL | WO 2006/046177 | * | 4/2006 |

OTHER PUBLICATIONS

Li, Quanchang et al, "Fabrication of ZnO Nanorods and Nanotubes in Aqueous Solutions", 2005, vol. 17, pp. 1001-1006.*
Deki, S. "Preparation and characterization of iron oxyhydroxide and iron oxide thin films by liquid-phase deposition", 1997, J. Mater. Chem., vol. 7, pp. 1769-1772.*
Caruntu, G. "Synthesis and characterization of nanocrystalline zinc ferrite films prepared by liquid phase deposition", 2004, J. Mater. Chem., vol. 14, pp. 2753-2759.*

(Continued)

*Primary Examiner*—David Vu
*Assistant Examiner*—Suberr Chi

(57) ABSTRACT

A thin film semiconductor and a method of its fabrication use induced crystallization and aggregation of a nanocrystal seed layer to form a merged-domain layer. The nanocrystal seed layer is deposited onto a substrate surface within a defined boundary. A reaction temperature below a boiling point of a reaction solution is employed. A thin film metal-oxide transistor and a method of its production employ the thin film semiconductor as a channel of the transistor. The merged-domain layer exhibits high carrier mobility.

16 Claims, 4 Drawing Sheets

OTHER PUBLICATIONS

Vayssieres, L. "Purpose-Built Anisotropic Metal Oxide Material: 3D Highly Oriented Microrod Array of ZnO", 2005, J. Phys. Chem B, vol. 105, pp. 3350-3352.*

J. Zhao et al, "Growth and Morphology of ZnO Nanorods prepared from Zn(NO3)2/NaOH Solutions", Feb. 28, 2006, Journal of the European Ceramic Society, vol. 26, pp. 3745-3752, hereafter Zhao.*

Greene, L.E. et al. "Low temperature wafer-scale production of ZnO nanowire arrays", 2003, Angew. Chem. Int. Edn, vol. 42, pp. 3031-3034.*

C. Pacholski et al, "Self-Assembly of ZnO: From Nanodots to Nanorods", vol. 41, pp. 1188-1191.*

E. Menard, "Bendable single crystal silicon thin film transistors formed by printing on plastic substrates", Applied Physics Letter, 86, 2005, pp. 093507-1 to 093507-3.

Thomas P. Niesen, "Review: Deposition of Ceramic Thin Films at Low Temperatures from Aqueous Solutions", Journal of Electroceramics, 6, 2001, pp. 169-207.

Quanchang et al: "Fabrication of ZnO Nanorods and Nanotubes in Aqueous Solutions" Chemistry of Mterials, Merican Chemical Soc. WA, US, vol. 17, Feb. 3, 2005, pp. 1001-1006.

* cited by examiner

FUSED NANOCRYSTAL THIN FILM SEMICONDUCTOR AND METHOD

BACKGROUND

1. Technical Field

The invention relates to nanotechnology. In particular, the invention relates to structures fabricated from nano-scale particles and crystals.

2. Description of Related Art

A thin film semiconductor is a semiconductor fabricated by depositing semiconductor material on a substrate using thin film techniques. In general, thin film semiconductors are divided into two main groups: inorganic thin film semiconductors and organic thin film semiconductors. The inorganic thin film semiconductors generally comprise an inorganic material having properties of a semiconductor. Examples of inorganic semiconductor materials include, but are not limited to, silicon (Si), germanium (Ge), gallium arsenide (GaAs), and various metal-oxides (e.g., zinc oxide-ZnO). Organic thin film semiconductors comprise an organic material such as a polymer, an oligomer, or similar molecules that exhibit semiconductor properties. In some instances, the organic thin film semiconductor also includes an inorganic material (e.g., an inorganic semiconductor material) suspended in a matrix of the organic material.

Among characteristics commonly associated with thin film semiconductors and devices realized therewith are an applicability to large-area substrates, an inherent mechanical flexibility, and optical transparency. In addition, thin film semiconductors are often employed where minimizing manufacturing costs is more important than device performance. For example, a principal use of thin film semiconductors is in the form of thin film transistors (TFTs) for liquid crystal display (LCD) applications (e.g., active matrix LCDs (AMLCDs) that employ TFTs to drive and control pixels of display). Since TFTs in LCDs are generally manufactured directly on a glass substrate of the display, such applications benefit from TFTs that exhibit inherent optical transparency (e.g., ZnO-based TFTs) as well as the ability to produce TFTs on large-area substrates using thin film semiconductors.

Inorganic thin film semiconductor fabrication usually involves depositing the inorganic semiconductor material on a substrate (e.g., glass, silicon wafer, etc.) using vacuum deposition. For example, vacuum deposition techniques such as physical vapor deposition (PVD), chemical vapor deposition (CVD), and plasma enhanced chemical vapor deposition (PECVD), are often used. As well as requiring a high vacuum, many vacuum deposition techniques subject the substrate to relatively high processing temperatures (>300° C.) during deposition. The resulting inorganic thin film semiconductor typically exhibit either an amorphous structure (e.g., a-Si:H) or a polycrystalline structure (e.g., p-Si). In some instances, annealing is used to post process the deposited thin film semiconductor to improve performance characteristics of the deposited semiconductor. Annealing may include either applying additional heat or using a laser, for example. The high temperatures as well as the requirements for achieving high vacuum during vacuum deposition often limit a material choice for and an ultimate size of a substrate. For example, high temperatures can preclude the use of some plastics as a substrate material. In addition, equipment costs for providing high vacuum to process very large substrates can be prohibitive.

Organic semiconductors have been developed, in part, to overcome the need for the high vacuum and the high temperatures typically associated with inorganic thin film semiconductor fabrication. Organic semiconductors are generally deposited as a liquid or a combination of a liquid and a solid using a method such as printing (e.g., screen printing). In some cases once deposited, the organic semiconductor is cured to produce the final thin film semiconductor. By contrast to inorganic thin film semiconductors, organic semiconductors are generally fabricated using relatively low temperature processing and ambient pressures. However, while capable of being fabricated at relatively low temperatures (e.g., <150° C.) and using relatively lower cost manufacturing equipment, organic thin film semiconductors generally exhibit poor performance characteristics (e.g., very low carrier mobility) when compared to inorganic semiconductors.

BRIEF SUMMARY

In some embodiments of the present invention, a method of fabricating a thin film semiconductor component is provided. The method of fabricating comprises depositing a nanocrystal seed layer on a substrate within a defined boundary on the substrate. The method of fabricating further comprising inducing crystallization and aggregation of the nanocrystal seed layer using a reaction solution to form the thin film semiconductor component. The thin film semiconductor component is formed at a reaction temperature below a boiling point of the reaction solution.

In other embodiments of the present invention, a method of producing a metal-oxide thin film transistor is provided. The method of producing comprising defining a reaction well on a substrate. The reaction well establishes an extent of a channel of the metal-oxide thin film transistor. The method of producing further comprising creating a metal-oxide nanocrystal seed layer within the defined reaction well. The method of producing further comprising fusing the nanocrystal seed layer using liquid-phase deposition within the reaction well. The liquid-phase deposition crystallizes and aggregates the metal-oxide nanocrystal seed layer to form a thin film semiconductor, the thin film semiconductor providing the channel of the metal-oxide thin film transistor.

In other embodiments of the present invention, a metal-oxide thin film semiconductor is provided. The metal-oxide thin film semiconductor comprises a merged-domain crystal layer of a metal-oxide. The merged-domain crystal layer is characterized by a carrier mobility between a carrier mobility of a polycrystalline layer of the metal-oxide semiconductor and a carrier mobility of a single crystal layer of the metal-oxide semiconductor.

Certain embodiments of the present invention have other features that are one or both of in addition to and in lieu of the features described hereinabove. These and other features of the invention are detailed below with reference to the following drawings.

BRIEF DESCRIPTION OF THE DRAWINGS

The various features of embodiments of the present invention may be more readily understood with reference to the following detailed description taken in conjunction with the accompanying drawings, where like reference numerals designate like structural elements, and in which.

DETAILED DESCRIPTION

Figure 1:
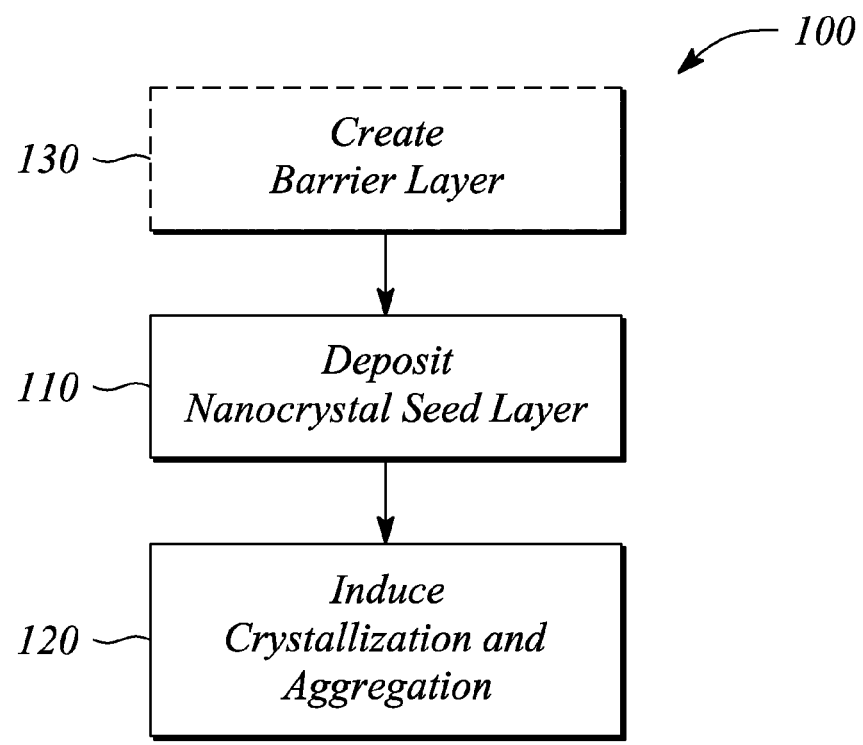
FIG. 1 illustrates a flow chart of a method of fabricating a thin film semiconductor component according to an embodiment of the present invention.

Embodiments of the present invention facilitate producing an inorganic thin film semiconductor component. For example, the inorganic thin film semiconductor component may be a channel of an enhancement mode thin film transistor (TFT). In some embodiments, the inorganic thin film semiconductor component comprises a metal-oxide semiconductor. Exemplary enhancement mode zinc oxide (ZnO) TFTs manufactured according to the present invention have exhibited high carrier mobility of approximately 100 centimeter squared per volt-second ($cm^2V^{-1}s^{-1}$), high On/Off ratios of approximately $10^7$ and low subthreshold slope performance of about 2 volts per decade (V/decade). The performance of the exemplary TFTs generally exceeds that of TFTs based on organic semiconductors as well as those that employ either an amorphous or a polycrystalline thin film semiconductor component.

According to the present invention, fabrication of the inorganic thin film semiconductor component employs a liquid-phase deposition process and involves relatively low processing temperatures and pressures. The liquid-phase deposition process crystallizes and aggregates a nanocrystal seed layer yielding a fused layer of the nanocrystals. The fused layer is characterized by a merged-domain crystalline structure. Among other things, the merged-domain crystalline structure supports a relatively high carrier mobility within the layer. In turn, the high carrier mobility enables production of high performance semiconductor components. The relatively low processing temperature facilitates production of thin film semiconductor components on a wide variety of substrates including, but not limited to, flexible plastic sheets. Together, the liquid-phase deposition and relatively low processing temperatures enable production of high quality semiconductor components at low costs and in a manner that is compatible with a wide array of manufacturing environments.

As used herein, 'nanocrystals' refers to essentially any crystalline nano-scale structures. For example, nanocrystals may comprise nanoparticles, nanorods, nanowires, nanobelts, nanotubes, and combinations thereof. As used herein, the nanocrystals are prefabricated using any known technique for producing such nanostructures. For example, prefabricated single-crystal nanowires may be grown using methods such as, but not limited to, vapor-liquid-solid (VLS), solution-liquid-solid (SLS), and non-catalytic vapor-phase epitaxy. Other methods for producing prefabricated nanocrystals include, but are not limited to, template-assisted synthesis, nanoimprint lithography (NIL), dip-pen nanolithography, self-assembly of nanoparticles, solution phase methods based on capping reagents, and solvothermal methods.

According to the present invention, the nanocrystals may comprise crystals of essentially any semiconductor material. For example, semiconductor nanocrystals comprising one or more of silicon (Si), germanium (Ge), compounds of indium (In) (e.g., indium phosphide-InP), and compounds of gallium (Ga) (e.g., gallium arsenide-GaAs) may be employed.

In some embodiments, the semiconductor material comprises a metal-oxide (M-O). For example, the nanocrystals may comprise essentially any metal-oxide of the form $M_xO_y$, wherein the metal 'M' is selected from zinc (Zn), tin (Sn), indium (In), aluminum (Al), magnesium (Mg), titanium (Ti) chromium (Cr), iron (Fe), cobalt (Co). nickel (Ni), copper (Cu), gallium (Ga), germanium (Ge), molybdenum (Mo), rubidium (Ru), rhodium (Rh), palladium (Pd), cadmium (Cd), antimony (Sb), hafnium (Hf), tantalum (Ta), tungsten (W), rhenium (Re), lead (Pb), and combinations thereof. The list of metals provided above is illustrative only and in no way considered a limitation herein. By convention, integer subscripts 'x' and 'y' indicate a relative quantity of the metal (M) and the oxygen (O), respectively, in the metal-oxide.

In other embodiments, the semiconductor material comprises either a metal-sulphide (M-S) having the form $M_xS_y$, where 'S' represents sulfur or a metal-selenide (M-Se) having the form $M_xSe_y$, where 'Se' represents selenium. In such embodiments, the nanocrystals may comprise essentially any of the metals listed above, for example. Moreover, it is within the scope of the various embodiments that other metal compounds and metal-like (e.g., semiconductor) compounds not listed above may be employed. For example, various ternary metal-oxide compounds such as, but not limited to, ZnSnO, may be employed for the nanocrystals. Examples described herein are provided for illustrative purposes only and not by way of limitation.

FIG. 1 illustrates a flow chart of a method 100 of fabricating an inorganic thin film semiconductor component according to an embodiment of the present invention. The method 100 of fabricating comprises depositing 110 a nanocrystal seed layer on a substrate within a defined boundary on the substrate. Once deposited 110, the nanocrystal seed layer comprises a plurality of nanocrystals arranged in one or more layers on the substrate surface.

In some embodiments, depositing 110 a nanocrystal seed layer employs a liquid suspension of prefabricated nanocrystals. The prefabricated nanocrystals may be provided by essentially any known means and may comprise nanowires, nanorods, nanoparticles, nanobelts, and combinations thereof, for example. In such embodiments, depositing 110 a nanocrystal seed layer comprises preparing a carrier solution by dispersing and suspending the prefabricated nanocrystals in a solvent. Depositing 110 a nanocrystal seed layer further comprises applying the carrier solution to the surface of a substrate. In some embodiments, depositing 110 a nanocrystal seed layer further comprises removing the solvent, such that the nanocrystal seed layer is left behind.

In various liquid suspension-based embodiments, the carrier solution may be applied using one or more of printing, spraying, spin-coating, and drop coating. For example, the carrier solution may be drop coated on the substrate surface. Drop coating refers to coating the substrate or a portion thereof using drops of the carrier solution. That is, the prepared carrier solution is formed into droplets. The drops are then directed toward, impact and adhere to the substrate. For example, a pipet or an eye dropper containing the carrier solution may be used to form the drops and gravity may be employed to propel the drops toward the substrate. In another example, drop coating is accomplished using an inkjet printer system. Yet other massively-parallel coating methods such as doctor-blade coating and gravure coating may also be employed.

In drop coating using an inkjet printer system, the carrier solution is loaded into an ink reservoir of an inkjet print head of the printer system. The inkjet print head under control of the inkjet printer is then employed to produce and propel droplets of the carrier solution toward the substrate in a manner essentially similar to printing a pattern on a piece of paper using conventional ink. Specifically, the carrier solution droplets are preferentially produced and propelled toward a region of the substrate that is within the defined boundary on the substrate. In addition, a sufficient quantity of droplets is applied by the print head such that the region of the substrate within the defined boundary is coated with an essentially continuous film of the carrier solution.

A specific amount or a particular thickness of the applied continuous film is dependent on a particular application and is related to a given loading or weight-percent (wt-%) of the nanocrystals in the carrier solution. In some embodiments, an applied film thickness is employed that is sufficient to yield an essentially continuous single layer (i.e., monolayer) of nanocrystals after removal of the solvent. In other embodiments, the carrier solution is applied having a film thickness such that multiple layers of nanocrystals are present in the nanocrystal seed layer following solvent removal.

For example, a film thickness of between 50 nm and 400 nm may yield from 2 to about 5 layers of nanocrystals in the nanocrystal seed layer. In other examples, film thicknesses up to about 2 microns and even greater is used. A number of layers produced is generally dependent on an average size of the nanocrystals as well as the wt-% of the nanocrystals in the carrier solution. In particular, whether or not a monolayer or multiple layers are present in the nanocrystal seed layer after solvent removal, in part, depends on an average size of the nanocrystals employed. For example, depositing 100 nm nanocrystals at a film thickness of 100 nm will generally yield a monolayer in the nanocrystal seed layer. In another example, employing nanocrystals with an average size that is smaller than 100 nm for the same 100 nm thick film will typically result in multiple layers within the nanocrystal seed layer.

In some embodiments, the solvent is removed using evaporation. The solvent may be evaporated from the applied carrier solution by heating the substrate, for example. In particular, the substrate may be heated on a hot plate or in an oven to evaporate the solvent. In some embodiments, a temperature below a boiling temperature of the solvent is employed to avoid either disturbing or disrupting a relatively continuous distribution of the nanocrystals within the nanocrystal seed layer during solvent removal. In some embodiments, the carrier solution further comprises a reagent, such as a surfactant. While a surfactant may be employed in the carrier solution, in general a carrier solution prepared without a surfactant may avoid possible contamination of the resultant nanocrystal seed layer with the surfactant material following solvent removal.

In other embodiments, depositing 110 comprises employing the prefabricated nanocrystals as an essentially dry powder (e.g., no carrier solution) and applying the powder directly to the substrate surface. For example, a technique such as, but not limited to, dust coating or powder coating may be employed to apply the powder containing the prefabricated nanocrystals. Applying the powder may employ electrostatic charge to one or more of direct the powder toward and promote powder adhesion to the substrate, in some embodiments. In yet other embodiments, depositing 110 a nanocrystal seed layer comprises growing the nanocrystals in situ on the substrate. For example, the nanocrystal seed layer may be a plurality of nanowires (i.e., the nanocrystals) that are grown in situ on the substrate using a vapor-liquid-solid method, or another method mentioned above.

In some embodiments, the substrate is an essentially rigid substrate. Rigid substrates include, but are not limited to, a glass panel, a silicon wafer, a silicon-on-insulator (SOI) wafer, a group II-VI compound semiconductor wafer, a group II-V compound semiconductor wafer, an anodized metal sheet, a sapphire wafer, and an alumina ($Al_2O_3$) substrate. In other embodiments, the substrate is an essentially flexible substrate, such as a polymeric (e.g., plastic) film or sheet. Exemplary polymers and plastics available as flexible sheets include, but are not limited to, high density polyethylene (HDPE), low density polyethylene (LDPE), polyethylene terephthalate (PET or Mylar®), cellulose acetate, polyvinyl chloride (PVC), polyimide (e.g, Kapton®), and various other commonly available plastics. Mylar® and Kapton® are registered trademarks of E. I. Du Pont De Nemours and Company Corporation, Delaware.

In some embodiments (not illustrated), either the rigid or the flexible substrate further comprises one or more layers of coating materials applied on the substrate surface. The layers are applied prior to depositing 110 a nanocrystal seed layer and essentially act as an interface between a native surface of the substrate and the nanocrystal seed layer. For example, an epoxy coating may be applied to an alumina substrate. The epoxy coating may reduce a surface roughness of the substrate, for example. In another example, one or more of an insulator layer (e.g., $SiO_2$) and a conductor layer (e.g., polysilicon, metal, etc.) may be either grown or applied to the native substrate surface. An insulator layer may be employed to electrically isolate the nanocrystal seed layer from the underlying substrate, for example. For simplicity of discussion only, no distinction is made herein between the substrate by itself and the substrate having additional layers unless such distinction is necessary for proper understanding.

By way of example, consider depositing 110 a nanocrystal seed layer comprising prefabricated ZnO nanocrystals using an aqueous carrier solution. In general, the ZnO nanocrystals may comprise particle sizes ranging from a few nanometers (nm) to more than tens of nanometers (nm). For example, the ZnO nanocrystals may have particle sizes ranging from 30 nanometers (nm) to 80 nm.

The exemplary aqueous carrier solution is prepared by suspending ZnO nanocrystals in water. For example, ultrapure deionized water having a resistivity of greater than about 18.0 megaohm-centimeter (MΩ-cm) is used. Suspending the ZnO nanocrystals in water is accomplished by mechanically mixing and dispersing the ZnO nanocrystals in the ultra-pure, deionized water. No surfactant is used. Instead, ultra-sonification is employed to both mix and disperse the ZnO nanocrystals, for example. Uniform dispersion of the ZnO nanocrystals provides high-quality thin film formation. An amount of ZnO nanocrystals loading in the aqueous carrier solution is generally between 0.01 wt-% and 0.5 wt-%, and in some cases, the amount is between 0.075 wt-% and 0.20 wt-%. For example, 0.10 wt-% of ZnO nanocrystals in water may be employed in the exemplary carrier solution.

The prepared exemplary carrier solution with the ZnO nanocrystals is then applied to the substrate within the defined boundary. For example, the carrier solution may be drop coated using an inkjet printer system. After the carrier solution is applied, the substrate is heated to and held at about 85° C. until the water evaporates from the applied carrier solution. Removal of the water leaves behind the ZnO nanocrystals to form the nanocrystal seed layer. A 2-dimensional (2D) voidage of approximately 11% with voids having an average Feret diameter of approximately 123 nm has been observed for an exemplary nanocrystal seed layer deposited 110 as described above.

Referring again to FIG. 1, the method 100 of fabricating further comprises inducing 120 crystallization and aggregation of the nanocrystal seed layer. In some embodiments, inducing 120 crystallization and aggregation employs a reaction solution applied to the nanocrystal seed layer. The reaction solution provides a source of additional crystal material. Inducing 120 crystallization and aggregation is performed at a reaction temperature that is below a boiling temperature of the reaction solution. As such, inducing 120 is essentially a liquid-phase process that fuses the nanocrystal seed layer by depositing the additional crystal material onto the seed layer. The induced 120 crystallization and aggregation form the thin film semiconductor component. In some embodiments, inducing 120 crystallization and aggregation is essentially similar to fusing nanowires using in situ crystal growth described by Pan et al., in co-pending U.S. Published Application No. 2006/0205240 A1, incorporated herein by reference.

In some embodiments, inducing 120 crystallization and aggregation comprises applying the reaction solution onto the deposited nanocrystal seed layer. Once applied, the reaction solution essentially immerses the nanocrystal seed layer. Inducing 120 further comprises raising a temperature of the reaction solution immersed nanocrystal seed layer to establish a reaction temperature. The reaction temperature is maintained for a predetermined period of time (i.e., reaction time) to facilitate crystallization and aggregation. The reaction time and the reaction temperature generally depend on a reaction solution and a nanocrystal seed layer being employed. However, the reaction time and the reaction temperature are readily determined for specific embodiments without undue experimentation.

In particular, in some embodiments the reaction temperature is below a boiling point of the reaction solution. For example, when employing an aqueous reaction solution, a reaction temperature may be chosen arbitrarily (e.g., 85° C.) that is below a boiling point of water. Other arbitrarily chosen reaction temperatures (e.g., 80-95° C.) also may be employed for the exemplary aqueous solution.

Reaction time generally depends on the reaction temperature as well as the particulars of the reaction solution (e.g., crystal source material, concentration, pH modifier type, solvent used, etc.). In practice, a reaction time is typically determined by an amount of time sufficient to fuse the nanocrystals into an essentially continuous film. For example, the reaction time may be determined by simply observing the reaction solution immersed nanocrystal seed layer during crystallization and aggregation and noting a time a uniform merged-domain layer is formed on a surface of the previously deposited 110 nanocrystal seed layer. Typical reaction times range from about 5 minutes to about 2 hours.

In some embodiments, the reaction solution comprises a solvent, a pH modifier, and a crystal source material. The solvent may comprise essentially any solvent into which the crystal source material may be dissolved. For example, water may be used as a solvent when the crystal source material is water soluble. In addition to water, other solvents including, but not limited to, ethanol, acetone, isopropanol, ethyl acetate, and various polymer-solvent gels, may be employed.

The pH modifier may comprise essentially any buffer, base or acid that is compatible with the solvent. For example when the solvent is water, a base such as, but not limited to, sodium hydroxide (NaOH), potassium hydroxide (KOH), ammonia ($NH_3$), and methaneamine ($CH_3NH_2$), and hexamine ($C_6H_{12}N_4$), may be employed as the pH modifier. In another aqueous solvent example, an acid including, but not limited to, hydrochloric acid (HCl), sulfuric acid ($H_2SO_4$), acetic acid ($CH_3COOH$), may be employed. In addition, certain buffers may be employed as the pH modifier.

The crystal source material provides a source of a crystal material that is essentially similar to a crystal material of the nanocrystal seed layer. For example, if the nanocrystal seed layer comprises the crystal material ZnO and the solvent is water, then one or more of zinc nitrate ($Zn(NO_3)_2$), zinc acetate ($Zn(C_2H_3O_2)_2$), zinc sulfate ($ZnSO_4$), and zinc chloride ($ZnCl_2$) may be employed as the crystal source material. In some embodiments, the crystal source material is the same as the crystal material of the nanocrystal seed layer. For example, when ZnO nanocrystals are used, ZnO may be employed as the crystal source material.

Continuing with the example involving ZnO nanocrystals, the exemplary reaction solution comprises an aqueous solution with hexamine as the pH modifier and zinc nitrate ($Zn(NO_3)_2$) as the crystal source material. For the example, an equimolar ratio of zinc nitrate and hexamine with a concentration of between 0.06 molar (M) and 0.15 M is used. The reaction solution is applied to the deposited 110 ZnO nanocrystal seed layer and a reaction temperature below a boiling point of the reaction solution is established by heating the substrate on a hot plate or in an oven. Specifically, a reaction temperature of between 80° C. and 90° C. is established. The reaction temperature is held for reaction time of approximately 1 hour. Reaction times may be less than as well as longer than 1 hour depending on the reaction temperature and a relative concentrations of the zinc nitrate ($Zn(NO_3)_2$) crystal source material and hexamine, for example.

In some embodiments, the defined boundary on the substrate is provided by the deposition means. For example, depositing using printing inherently defines a location and an extent of the printed carrier solution. Similarly, spraying and drop coating may provide a well defined location of a deposited nanocrystal seed layer. For example, an ink jet printer may be employed to selectively drop coat the carrier solution within the defined boundary. In another example, an electrostatic charge differential may be employed to selectively deposit the nanocrystals within the defined boundary when employing powder coating.

In other embodiments, a barrier layer is employed on the substrate to define the boundary for depositing 110 a nanocrystal seed layer. In particular, an opening or a well in the barrier layer may define the boundary. In some embodiments, the method 100 of fabricating may optionally further comprise creating 130 a barrier on a surface of the substrate. In some embodiments, creating 130 a barrier comprises applying a material that forms the barrier layer to the surface of the substrate. Creating 130 a barrier further comprises forming a well in the applied barrier layer material. An extent of the formed well defines the boundary for depositing 110 a nanocrystal seed layer. In some embodiments, the well formed during creating 130 a barrier additionally functions as a reaction container for the reaction solution that is used during inducing 120 crystallization and aggregation. As such, the well is referred to as a 'reaction well' herein.

For example, the created 130 barrier layer may be a photoresist layer that is applied to the substrate surface. The photoresist layer is approximately 1.5 microns (μm) thick, for example. After applying the photoresist layer, the reaction well is formed in the photoresist layer by patterning using a lithographic method (e.g., photolithography). In another example, the barrier layer material is a moldable material such as, but not limited to, polycarbonate, polymethylmethacrylate (PMMA) and methylmethacrylate (MMA), and the reaction well is created 130 using imprint lithography in conjunction with the exemplary applied barrier layer material. In yet another example, the barrier layer is a layer that is applied, patterned and etched using conventional semiconductor fabrication techniques to create the reaction well. For example, the barrier layer may comprise a dielectric on the substrate (e.g., native or thermal oxide of an Si substrate), into which is etched a cavity to expose the substrate surface. In another example, the barrier layer may be a self-assembled monolayer (SAM).

In some embodiments, the barrier layer may essentially protect portions of the substrate beyond the extent of the reaction well such that deposition 110 occurs preferentially within the reaction well. In particular, in addition to providing the reaction well, the barrier layer may either inhibit deposition of the nanocrystal seed layer beyond the reaction well boundary or provide a means for removing any excess nanocrystal seed layer that is deposited outside the reaction well boundary. For example, any nanocrystal seed layer that is deposited on a surface of a photoresist layer may be removed by removing the photoresist (e.g., using a solvent to wash away the photoresist after inducing 130 crystallization and aggregation).

Figure 2A:
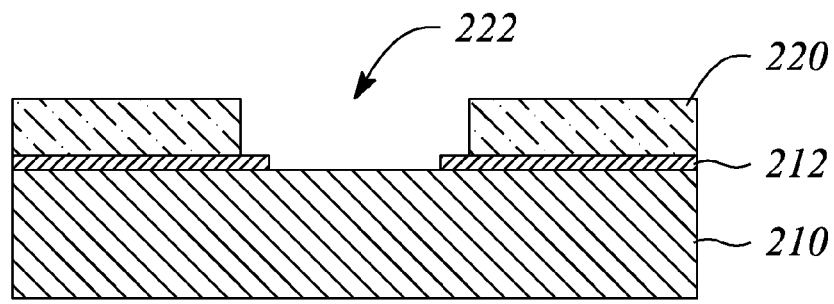
FIG. 2A illustrates a cross sectional view of a substrate prior to depositing a nanocrystal seed layer according to an embodiment of the present invention.

FIG. 2A illustrates a cross sectional view of a substrate 210 prior to depositing a nanocrystal seed layer according to an embodiment of the present invention. In particular, FIG. 2A illustrates a barrier layer 220 on a surface of the substrate 210. Further illustrated in FIG. 2A is a reaction well 222 in the barrier layer 220. The reaction well 222 establishes a defined boundary for depositing a nanocrystal seed layer. In some embodiments, the reaction well 222 and barrier layer 220 are created 130 as described above with respect to the method 100 of fabricating.

In some embodiments the substrate 210 further comprises a conductor layer 212 on a surface of the substrate. In some embodiments, the conductor layer 212 may extend into the reaction well 222, as is illustrated in FIG. 2A.

Figure 2B:
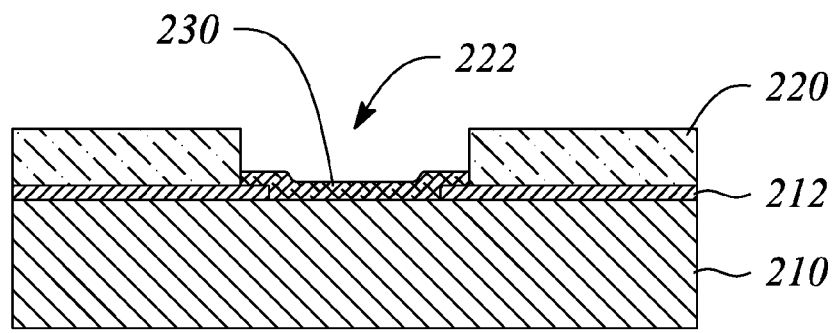
FIG. 2B illustrates a cross sectional view of the substrate illustrated in FIG. 2A following depositing a nanocrystal seed layer according to an embodiment of the present invention.

FIG. 2B illustrates a cross sectional view of the substrate 210 illustrated in FIG. 2A following deposition of a nanocrystal seed layer 230 according to an embodiment of the present invention. In particular, the nanocrystal seed layer 230 is illustrated in FIG. 2B as having been preferentially deposited in the reaction well 222. For example, a carrier solution is drop coated into the reaction well 222. Following drop coating, a solvent of the carrier solution is removed (e.g., evaporated) to leave behind the nanocrystal seed layer 230, as illustrated in FIG. 2B. In some embodiments, depositing 110 a nanocrystal seed layer described above with respect to the method 100 may be employed to deposit the nanocrystal seed layer 230.

Figure 2C:
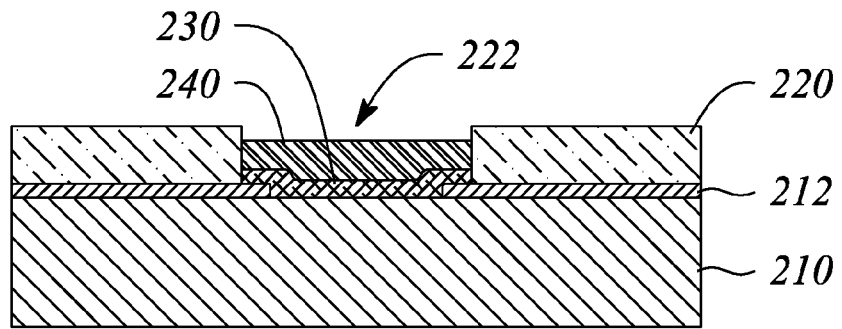
FIG. 2C illustrates a cross sectional view of the substrate illustrated in FIG. 2B during crystallization and aggregation of the nanocrystal seed layer according to an embodiment of the present invention.

FIG. 2C illustrates a cross sectional view of the substrate 210 illustrated in FIG. 2B during crystallization and aggregation of the nanocrystal seed layer 230 according to an embodiment of the present invention. As illustrated in FIG. 2C, a reaction solution 240 has been placed in the reaction well 222. The reaction solution 240 covers and immerses the nanocrystal seed layer 230. The substrate 210 is heated to a reaction temperature (e.g., 85° C.) and the nanocrystal seed layer 230 is fused by the crystallization and aggregation into a merged-domain layer. In some embodiments, the crystallization and aggregation of the nanocrystal seed layer 230 illustrated in FIG. 2C is provided by inducing 120 crystallization and aggregation, which is described above with respect to the method 100 of fabricating.

Figure 3A:
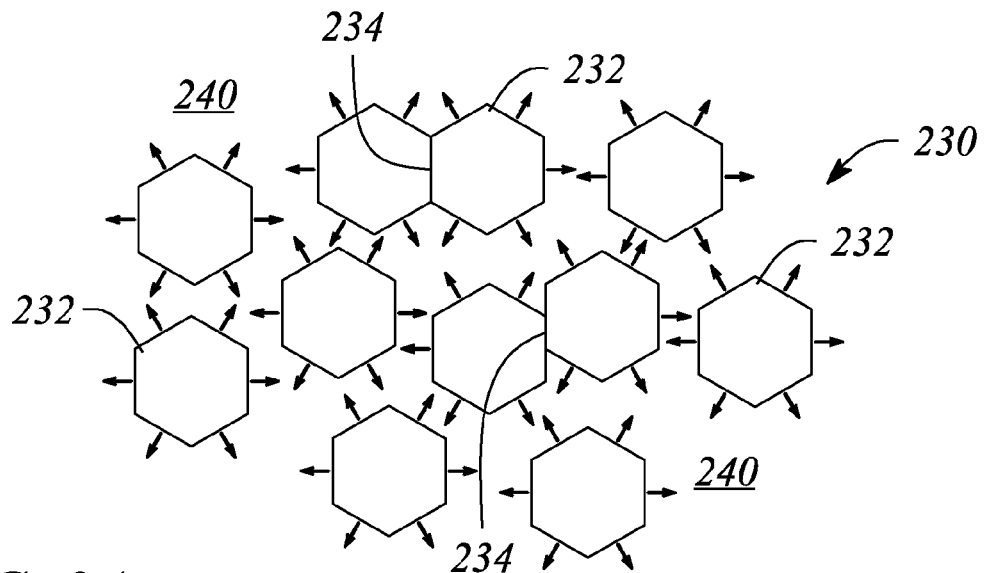
FIG. 3A illustrates a schematic view of an early stage of crystallization and aggregation according to an embodiment of the present invention.
Figure 3B:
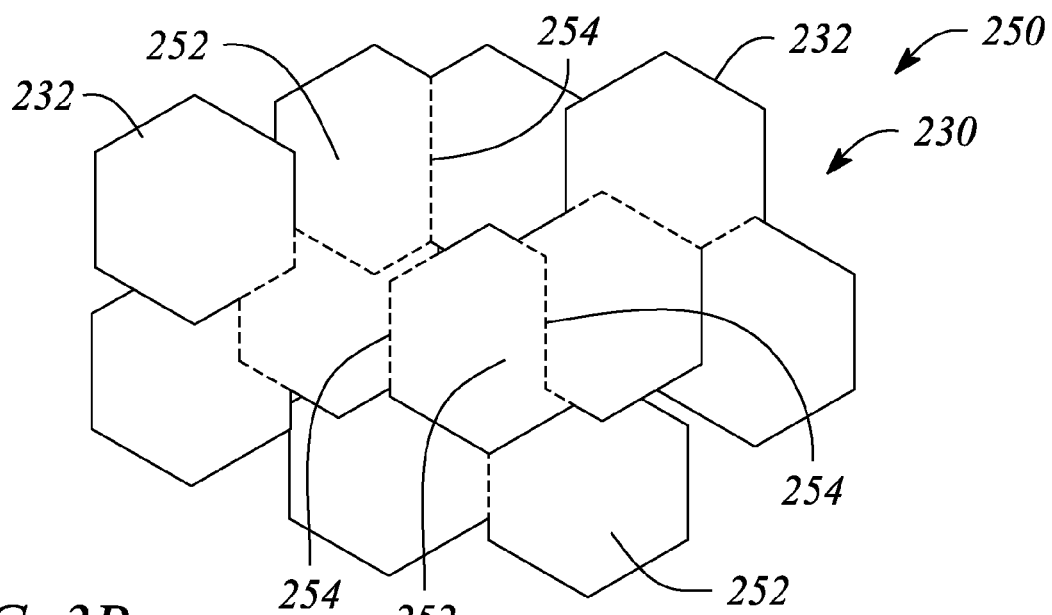
FIG. 3B illustrates a schematic view of a later stage of crystallization and aggregation according to an embodiment of the present invention.

FIG. 3A illustrates a schematic view of an early stage of crystallization and aggregation according to an embodiment of the present invention. FIG. 3B illustrates a schematic view of a later stage of crystallization and aggregation according to an embodiment of the present invention. In particular, FIG. 3A illustrates formation of crystal grains 232 during an early stage of crystallization and aggregation. Individual nanocrystals within the nanocrystal seed layer 230 act as nucleation sites or 'seeds' during the initial formation of the crystal grains 232. The crystal grains 232 grow outward from the nucleation site due to liquid-phase deposition of crystal material from the reaction solution 240. Arrows in FIG. 3A indicate the growth of the crystal grains 232. Eventually, some adjacent crystal grains 232 join with one another at intersecting grain boundaries 234 during the early stage, as illustrated in FIG. 3A.

As crystallization and aggregation continues, more crystal grains 232 begin to fuse or merge with one another along the intersecting boundaries 234. With time, the merging adjacent crystal grains 232 produce a merged-domain layer 250, illustrated in FIG. 3B. In particular, some of the intersecting grain boundaries 234 eventually become less distinct and even disappear as liquid-phase deposition continues during the crystallization and aggregation. As the intersecting boundaries 234 become less distinct, the previously individual adjacent crystal grains 232 essentially merge to form a single larger crystal grain 252. The merged-domain layer 250 has fewer but larger individual crystal grains 252 than were present in earlier stages of crystallization and aggregation. In FIG. 3B, dashed lines illustrate locations of boundaries 254 between individual crystal grains 232 that have essentially disappeared as a result of crystallization and aggregation.

Figure 3C:
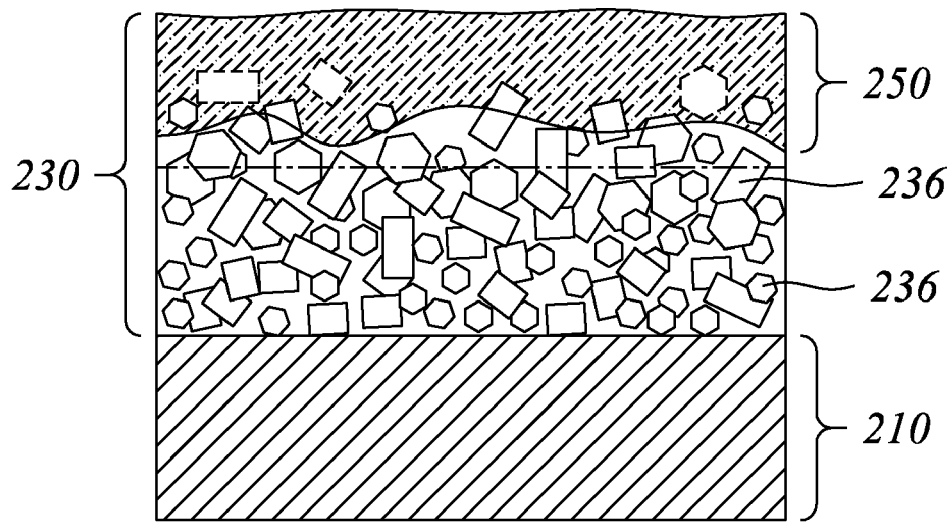
FIG. 3C illustrates a magnified, cross sectional view showing a merged-domain layer formed in a top portion of a nanocrystal seed layer on a substrate according to an embodiment of the present invention.

FIG. 3C illustrates a magnified, cross sectional view showing a merged-domain layer 250 formed in a top portion of a nanocrystal seed layer 230 on a substrate 210 according to an embodiment of the present invention. In particular, as illustrated in FIG. 3C, nanocrystals of the nanocrystal seed layer 230 in the top portion have fused due to crystallization and aggregation to form the merged-domain layer 250. As illustrated in FIG. 3C, some individual crystal grains 236 may remain within the merged-domain layer 250.

In some embodiments, the merged-domain layer 250 is formed on a top or upper portion of the nanocrystal seed layer 230, as illustrated in FIG. 3C. In other embodiments (not illustrated), the merged-domain layer 250 forms within the deposited nanocrystal seed layer. In some embodiments, individual crystal grains 232 may still be evident to some extent after crystallization and aggregation especially below the merged-domain layer 250 nearer the substrate 210. While crystal grains 232 nearer the substrate 210 may be individually distinguishable, the crystal grains 232 are generally tightly aggregated and packed together as a result of crystallization and aggregation. Furthermore, there may not be a sharp boundary between the merged-domain layer 250 and an underlying nanocrystal seed layer 230. Therefore, FIG. 3C is illustrative only.

An overall effect of the creation of merged boundaries in the merged-domain layer 250 is an apparent reduction in a number of distinct and separate crystal grains or domains 252 in the merged-domain layer 250 compared to a number of crystal domains 252 present earlier in crystallization and aggregation. The relatively fewer domain boundaries results in a higher carrier mobility within the formed thin film semiconductor. For example, a ZnO thin film semiconductor having a merged-domain layer 250 may exhibit a carrier mobility equal to or greater than 100 $cm^2V^{-1}s^{-1}$. In fact, a carrier mobility of about 109 $cm^2V^{-1}s^{-1}$ has been measured for a ZnO thin film with a merged-domain layer 250 fabricated according to method 100. In contrast, a typical amorphous ZnO thin film semiconductor has a carrier mobility on the order of 1 $cm^2V^{-1}s^{-1}$ while a polycrystalline ZnO thin film may have a carrier mobility that is as high as about 25 $cm^2V^{-1}s^{-1}$. Thus, amorphous and polycrystalline thin film semiconductors typically exhibit measurably lower carrier mobility than that demonstrated for a thin film semiconductor having the merged-domain layer 250, according to the present invention.

In general, the merged-domain layer 250 is further distinguished from a typical polycrystalline layer in that there are distinct grain boundaries in the latter that are essentially not present in the former. In particular, in the merged-domain layer 250, adjacent crystal grains 252 are largely fused together into continuous crystalline structure with few if any distinct grain boundaries. On the other hand, polycrystalline layers have distinct grain boundaries.

Furthermore, the merged-domain layer 250 exhibits a structurally interconnected network of tightly packed signal crystal grains fused to form an essentially continuous thin film. Specifically, unlike the essentially random grain orientations observed in polycrystalline layers, the merged-domain layer 250 typically exhibits crystal domains 252 having a preferred orientation. For example, when nanowires are employed as the nanocrystals, the nanowires have a tendency to orient parallel with one another when the nanocrystal seed layer 230 is deposited. As a result, the crystal domains 252 of the merged-domain layer 250 tend to be preferentially oriented in a manner corresponding to the parallel-oriented nanocrystals of the nanocrystal seed layer 230.

In addition, a size and geometrical shape of the crystal domains 252 within the merged-domain layer 250 is more uniform compared to a polycrystalline layer. In particular, the merged-domain layer 250 grows from a nanocrystal seed layer 230 having nanocrystals with similar sizes and shapes (e.g., 30 nm nanowires), in some embodiments. The crystal domains 252 that form during crystallization and aggregation grow essentially simultaneously from the similar sized and shaped individual nanocrystals. As a result, the crystal domains 252 are all essentially the same size and shape. In contrast, polycrystalline layers exhibit crystal grains with widely varied sizes and geometrical shapes.

Further, as mentioned above, the merged-domain layer 250 exhibits a carrier mobility that is higher than a polycrystalline layer. In particular, the merged-domain layer 250 may exhibit a carrier mobility that is on the order of that associated with a single-crystal layer. In part, as crystal domains 250 diminish during crystallization and aggregation, the merged-domain 250 becomes more like a single-crystal layer. In addition, when used in a device (e.g., TFT), individual crystal grains 252 within the merged-domain layer 250 may be large enough to act as a single-crystal semiconductor within an active region (e.g., channel) of the device. For example, if such a relatively large crystal domain 252 of the merged-domain layer 250 spanned from a drain to a source of a TFT, a carrier mobility observed in a channel of the TFT would be essentially that of a single-crystal semiconductor.

Figure 4:
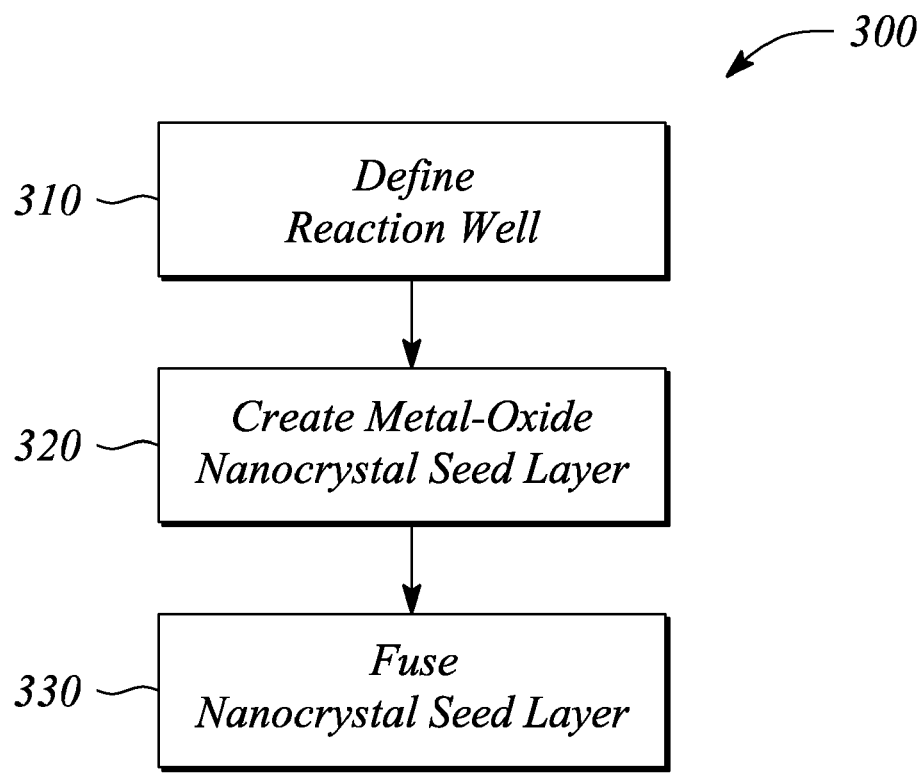
FIG. 4 illustrates a flow chart of a method of producing a metal-oxide thin film transistor according to an embodiment of the present invention.

FIG. 4 illustrates a flow chart of a method 300 of producing a metal-oxide thin film transistor according to an embodiment of the present invention. The method 300 of producing a metal-oxide thin film transistor comprises defining 310 a reaction well on a substrate. The defined reaction well establishes an extent of a channel of the metal-oxide thin film transistor, according to some embodiments.

The method 300 of producing a metal-oxide thin film transistor further comprises creating 320 a metal-oxide nanocrystal seed layer within the defined 310 reaction well. In some embodiments, the metal-oxide nanocrystal seed layer may be created 320 in a manner that is essentially similar to depositing 110 a nanocrystal seed layer, which is described above with respect to the method 100. For example, the metal-oxide nanocrystal seed layer 320 may be created 320 by depositing a carrier solution comprising prefabricated nanocrystals of the metal-oxide into the defined 310 reaction well and then removing a solvent of the carrier solution.

The method 300 of producing a metal-oxide thin film transistor further comprises fusing 330 the nanocrystal seed layer using liquid-phase deposition. In some embodiments, fusing 330 takes place within the reaction well. The liquid-phase deposition crystallizes and aggregates the metal-oxide nanocrystal seed layer to form a thin film metal-oxide semiconductor. In some embodiments, the formed thin film metal-oxide semiconductor is the channel of the metal-oxide thin film transistor.

In some embodiments, fusing 330 the nanocrystal seed layer is essentially similar to inducing 120 crystallization and aggregation that is described above with respect to the method 100. In particular, in some embodiments, fusing 330 comprises depositing into the reaction well, a reaction solution comprising a solvent, a pH modifier, and a crystal source material for the crystallization and aggregation. For example, the solvent may be water (e.g., ultra-pure, deionized water), the pH modifier may be hexamine, and the crystal source material may be zinc nitrate ($Zn(NO_3)_2$). Furthermore, the hexamine and the $Zn(NO_3)_2$ may be dissolved in the water in an equimolar ratio of between 0.06 M and 0.15 M, for example. In some embodiments, fusing 330 the nanocrystal seed layer further comprises heating the deposited reaction solution to a reaction temperature that is less than a boiling point of reaction solution.

Figure 5:
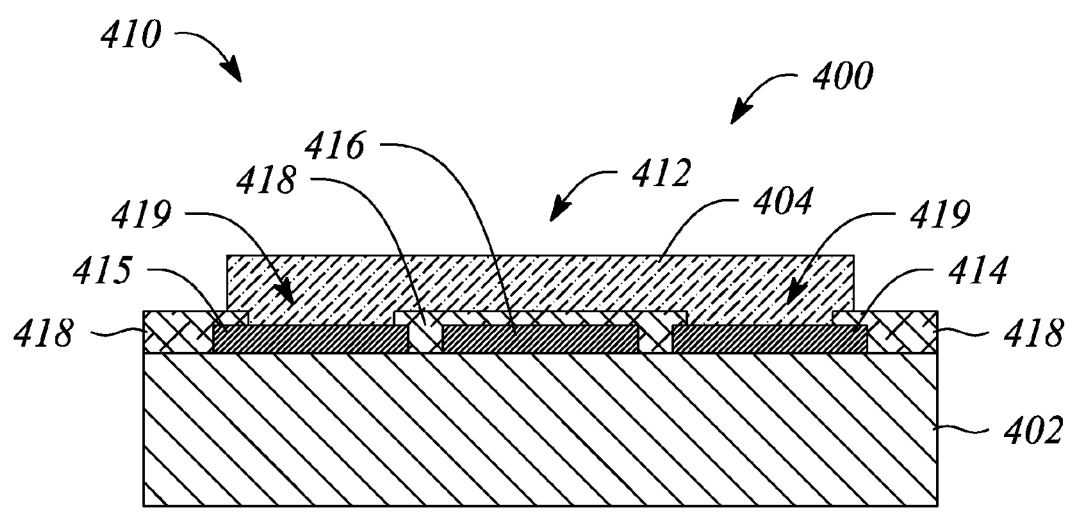
FIG. 5 illustrates cross sectional view of a thin film semiconductor according to an embodiment of the present invention.

FIG. 5 illustrates a cross sectional view of a thin film semiconductor 400 according to an embodiment of the present invention. In particular, the thin film semiconductor 400 is illustrated on a substrate 402. The thin film semiconductor 400 comprises a merged-domain metal-oxide crystal layer 404.

The merged-domain metal-oxide crystal layer 404 is characterized by a carrier mobility that is greater than that of a semiconductor comprising a conventional polycrystalline layer. In particular, the carrier mobility of the thin film semiconductor 400 is between a carrier mobility of a polycrystalline thin film metal-oxide semiconductor and a carrier mobility of a single crystal metal-oxide semiconductor.

As illustrated in FIG. 5, the metal-oxide thin film semiconductor 400 is a channel 412 of a metal-oxide thin film transistor 410. The thin film transistor 410 further comprises a drain 414, a source 415, and a gate 416. As illustrated, the drain 414, the source 415, and the gate 416 comprise a conductor layer(s) (e.g., metal, doped polycrystalline semiconductor, etc.). For example, patterned aluminum doped zinc oxide (Al:ZnO) deposited using direct current (DC) sputtering may be employed for one or more of the drain 414, the source 415 and the gate 416. The drain 414 and the source 415 connect to a first end and a second end of the channel 412 formed by the metal-oxide thin film semiconductor 400.

In some embodiments, an insulator 418 separates the gate 416 from the channel 412. For example, the insulator 418 may be a dielectric that covers the drain 414, the source 415, and the gate 416. The insulator 418 is applied before the metal-oxide thin film semiconductor 400 is deposited. Vias 419 in the insulator 418 facilitate electrical contact between the channel 412 and the drain 414 and, between the channel 412 and source 415. The vias 419 are formed (e.g., etched) in the dielectric covering the drain 414 and the source 415 prior to depositing the semiconductor 400, for example.

In FIG. 5, the gate 416 is illustrated as being below the channel 412 but on a surface of the substrate 402. In some embodiments (not illustrated), the gate is formed within the substrate itself. For example, a doped portion of the substrate supporting the channel may be employed as the gate. In some embodiments (not illustrated), the gate is above the channel (e.g., formed on top of the channel). In yet other embodiments (not illustrated), the gate is both above and below the channel.

In some embodiments, the metal-oxide thin film semiconductor 400 is produced by the method 300 of producing a metal-oxide thin film transistor described above. For example, the thin film semiconductor 400 may comprise ZnO nanocrystals deposited as a nanocrystal seed layer and then fused using liquid-phase deposition to yield the merged-domain layer. The thin film semiconductor 400, having the merged-domain layer 404, may exhibit high carrier mobility on the order of 100 $cm^2V^{-1}s^{-1}$. An exemplary thin film transistor 410 was measured to have a carrier mobility of 109 $cm^2V^{-1}s^{-1}$, a current ON/OFF ($I_{ON/OFF}$) ratio of about $10^7$, and a subthreshold voltage slope of approximately 2 volts per decade (V/dec).

In some embodiments, the thin film semiconductor 400 comprises highly aggregated metal-oxide crystal grains. In particular, crystal grain sizes may be relatively smaller near the substrate 402 that supports the thin film semiconductor 400. The crystal grain size generally increases with distance from the substrate 402, and becomes relatively larger at a surface of the thin film semiconductor 400 away from the substrate 402 (i.e., adjacent to the gate 416). For example, near the substrate 402, the crystal grain size may be on the order of 30 nm to 100 nm. In some cases, this grain size is similar to a size range of the nanocrystals in a nanocrystal seed layer that is used to produce the thin film semiconductor 400. At the surface, the grain sizes are substantially larger and indicative of the merged-domain layer 404.

Thus, there have been described embodiments of a metal-oxide thin film transistor, a thin film semiconductor component and methods of making the same. It should be understood that the above-described embodiments are merely illustrative of some of the many specific embodiments that represent the principles of the present invention. Clearly, numerous other arrangements may be readily devised without departing from the scope of the present invention as defined by the following claims.

What is claimed is:

1. A method of fabricating a thin film semiconductor component, the method comprising:
   depositing a nanocrystal seed layer on a substrate within a defined boundary on the substrate, nanocrystals of the nanocrystal seed layer being prefabricated before depositing and arranged in a plurality of layers on the substrate; and
   inducing crystallization and aggregation of the nanocrystal seed layer using a reaction solution, such that the thin film semiconductor component is formed, the induced crystallization and aggregation creating a merged-domain layer in the nanocrystal seed layer adjacent to a top surface of the thin film semiconductor component,
   wherein the thin film semiconductor component is formed at a reaction temperature below a boiling point of the reaction solution.

2. The method of fabricating of claim 1, wherein the reaction solution is an aqueous solution and the reaction temperature less than 100 degrees C.

3. The method of fabricating of claim 1, further comprising:
   applying a baffler layer on a surface of the substrate; and
   forming a reaction well in the barrier layer, an extent of the formed reaction well defining the boundary.

4. The method of fabricating of claim 3, wherein the barrier layer is a photoresist layer that is applied to the substrate surface, the reaction well being formed in the photoresist layer.

5. The method of fabricating of claim 1, wherein depositing a nanocrystal seed layer comprises one or more of printing, spraying, spin coating, dip coating, and drop coating a carrier solution, the carrier solution comprising nanocrystals suspended in a solvent.

6. The method of fabricating of claim 5, wherein an amount of the nanocrystals in the solvent is between about 0.075 weight-percent (wt-%) to about 0.20 wt-%.

7. The method of fabricating of claim 5, further comprising evaporating the solvent following depositing a nanocrystal seed layer.

8. The method of fabricating of claim 1, wherein inducing crystallization and aggregation comprises depositing a reaction solution onto the nanocrystal seed layer, the reaction solution comprising a solvent, a pH modifier, and a crystal source material for the crystallization.

9. The method of fabricating of claim 8, wherein the nanocrystal seed layer comprises a plurality of zinc oxide (ZnO) nanocrystals, the solvent comprises water ($H_2O$), the pH modifier comprises hexamine, and the crystal source material comprises zinc nitrate ($Zn(NO_3)_2$) dissolved in the water.

10. The method of fabricating of claim 8, wherein the hexamine and $Zn(NO_3)_2$ have an equimolar ratio between 0.06 and 0.15 molar in the reaction solution.

11. The method of fabricating of claim 1, wherein the semiconductor component is a channel of a thin film transistor.

12. The method of fabricating of claim 1, wherein the formed thin film semiconductor component comprises a merged-domain layer resulting from the induced crystallization and aggregation of the nanocrystal seed layer.

13. A method of producing a metal-oxide thin film transistor, the method comprising:
   defining a reaction well on a substrate, the reaction well establishing an extent of a channel of the metal-oxide thin film transistor;
   creating a metal-oxide nanocrystal seed layer within the defined reaction well, nanocrystals of the nanocrystal seed layer being prefabricated before creating the metal-oxide nanocrystal seed layer and arranged in a plurality of layers within the reaction well; and
   fusing the metal-oxide nanocrystal seed layer to form a merged-domain layer in the nanocrystal seed layer using liquid-phase deposition within the reaction well, the merged-domain layer being adjacent to a top surface of the nanocrystal seed layer,
   wherein the liquid-phase deposition crystallizes and aggregates an upper portion of the metal-oxide nanocrystal seed layer into the merged-domain layer to form a thin film metal-oxide semiconductor, the thin film metal-oxide semiconductor providing the channel of the metal-oxide thin film transistor.

14. The method of producing a metal-oxide thin film transistor of claim 13, wherein the metal-oxide is zinc oxide (ZnO), the thin film transistor being a ZnO thin film transistor, and wherein a layer of the thin film metal-oxide semiconductor is a merged-domain layer.

15. The method of producing a metal-oxide thin film transistor of claim 13, wherein fusing the metal-oxide nanocrystal seed layer comprises:

depositing a reaction solution comprising a solvent, a pH modifier, and a crystal source material for the crystallization and aggregation into the reaction well on the created metal-oxide nanocrystal seed layer.

16. The method of producing a metal-oxide thin film transistor of claim 15, wherein fusing the metal-oxide nanocrystal seed layer further comprises heating the deposited reaction solution to a reaction temperature that is less than a boiling point of reaction solution.

* * * * *

UNITED STATES PATENT AND TRADEMARK OFFICE
CERTIFICATE OF CORRECTION

PATENT NO. : 7,622,371 B2  Page 1 of 1
APPLICATION NO. : 11/548230
DATED : November 24, 2009
INVENTOR(S) : Alfred I-Tsung Pan et al.

It is certified that error appears in the above-identified patent and that said Letters Patent is hereby corrected as shown below:

On the title page, item (75), Inventors, in column 1, line 1, delete "Alfred Pan," and insert -- Alfred I-Tsung Pan, --, therefor.

In column 14, line 12, in Claim 3, delete "baffler" and insert -- barrier --, therefor.

Signed and Sealed this

Twentieth Day of April, 2010

David J. Kappos
*Director of the United States Patent and Trademark Office*